(12) United States Patent
Hon

(10) Patent No.: US 6,933,160 B2
(45) Date of Patent: Aug. 23, 2005

(54) METHOD FOR MANUFACTURING OF A VERTICAL LIGHT EMITTING DEVICE STRUCTURE

(75) Inventor: Schang-Jing Hon, Pa Te (TW)

(73) Assignee: Supernova Optoelectronics Corp., Taipei (TW)

(*) Notice: Subject to any disclaimer, the term of this patent is extended or adjusted under 35 U.S.C. 154(b) by 0 days.

(21) Appl. No.: 10/745,601

(22) Filed: Dec. 29, 2003

(65) Prior Publication Data

US 2004/0135158 A1 Jul. 15, 2004

(30) Foreign Application Priority Data

Jan. 3, 2003 (TW) .................................. 92100114 A (51) Int. Cl.[7] .......................... H01L 21/20; H01L 21/46
(52) U.S. Cl. .................... 438/22; 438/459; 438/464; 438/33
(58) Field of Search .................. 438/22–47, 455–665, 438/977

(56) References Cited

U.S. PATENT DOCUMENTS

| | | | | |
|---|---|---|---|---|
| 5,362,682 A | * | 11/1994 | Bozler et al. | 438/458 |
| 5,391,257 A | * | 2/1995 | Sullivan et al. | 438/458 |
| 6,177,359 B1 | * | 1/2001 | Chen et al. | 438/751 |
| 6,448,102 B1 | * | 9/2002 | Kneissl et al. | 438/46 |
| 6,555,405 B2 | * | 4/2003 | Chen et al. | 438/22 |
| 6,562,701 B2 | * | 5/2003 | Ishida et al. | 438/479 |
| 6,677,173 B2 | * | 1/2004 | Ota | 438/22 |
| 6,759,139 B2 | * | 7/2004 | Kunisato et al. | 428/620 |
| 6,790,695 B2 | * | 9/2004 | Ogihara et al. | 438/33 |
| 6,800,500 B2 | * | 10/2004 | Coman et al. | 438/22 |
| 6,830,946 B2 | * | 12/2004 | Yanagisawa et al. | 438/26 |
| 6,858,518 B2 | * | 2/2005 | Kondo | 438/458 |
| 2003/0138983 A1 | * | 7/2003 | Biwa et al. | 438/46 |

* cited by examiner

*Primary Examiner*—Savitri Mulpuri
(74) *Attorney, Agent, or Firm*—Troxell Law Office, PLLC (57) ABSTRACT

Disclosed are a vertical GaN based light-emitting device (LED) structure and the manufacturing method thereof. In the structure and the corresponding method, a substrate unit having a mask is used to form a multi-layer epitaxial structure and the substrate and the multi-layer epitaxial structure are separated at the mask. After the multi-layer epitaxial structure is extracted, a metal reflector may be disposed thereunder. Next, a conductive substrate is bonded to the metal reflector. Next, an upper surface of the multi-layer structure is disposed with a p-electrode and a bottom side of the conductive substrate with an n-electrode whereby an vertical LED structure is formed.

19 Claims, 9 Drawing Sheets

METHOD FOR MANUFACTURING OF A VERTICAL LIGHT EMITTING DEVICE STRUCTURE

BACKGROUND OF THE INVENTION

1. Field of the Invention

The present invention is related to a light-emitting device (LED) structure of and the manufacturing method thereof, and particularly to, a vertical GaN-based LED structure and the manufacturing method thereof. More particularly, the vertical LED structure is a completely vertical structure and has a larger lighting area and the corresponding manufacturing method may be simplified at the same time.

2. Description of Related Art

Light-emitting diodes (LEDs) have been widely known as useful lighting facilities and expected to become the most important and efficient ones. As we see, they have been founded useful in some important applications, such as communications and other areas, such as mobile phone and some appliances. Recently, there is a trend that further introducing LEDs to ordinary human living utilization, such as large panels, traffic lights and lighting facilities and the perspective thereof are looking good. Therefore, LEDs are increasingly playing an important role in our daily life and deserving more of our efforts.

Figure 15:
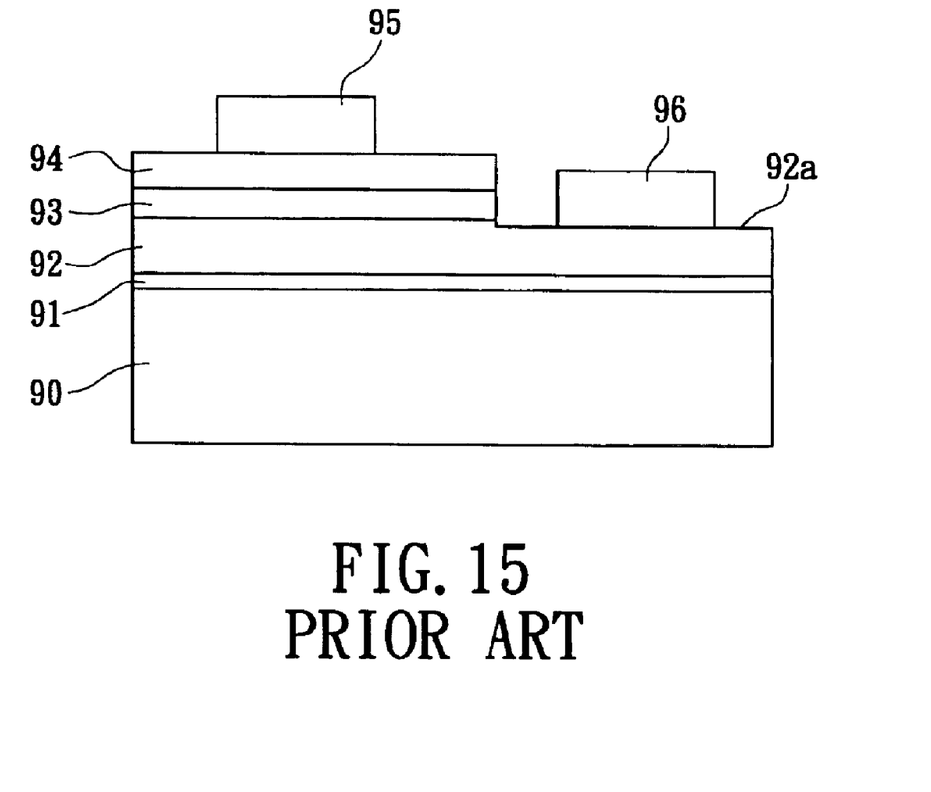
FIG. 15 depicts schematically a perspective view of a light-emitting for a prior GaN based LED.

However, brightness has always been the biggest issue in the field, which has been challenging the more practical uses of LEDs in human living utilization. For the recent years, many efforts have been thrown in to improvement of brightness of LEDs. However, the results are not satisfactory enough in quest of the LED-based lighting facilities, one of the reasons is that the n-electrode is in the way of the produced light when the light emits out of the device. In appreciating this, please refer to FIG. 15 illustrating a prior light-emitting device for a GaN based LED. In the figure, the light-emitting device has a substrate 90, mostly a sapphire. Over the substrate 90, a buffering layer 91, an n-GaN based layer 92, a multi-quantum well (MQW) layer 93, a p-GaN layer 94 are formed in sequence. Next, an etching method is employed to form an exposing region 92a on the n-GaN based layer 92. Finally, the n-electrode 96 and p-electrode 95 are respectively formed on the desirable area (shown in FIG. 1). In the n-electrode's view, the light-emitting device structure is not completely a pure vertical structure, which leads to a reduction of the lighting surface of the device.

However, at the same time, the n-electrode on a light-emitting device may not be omitted since an LED needs to work with an electric bias fed and the corresponding excitation, and hence the n- and p-electrodes are both indispensable. However, the n-electrode is a source of limiting the lighting area according to the state of the art, also described above, and hence one of the reasons limiting the luminous efficiency of the LED since the n-electrode may hinder the lighting area on the LED, which may be readily known through FIG. 15, through which the desired light is emitted. Therefore, the illumination produced by the LED has long been not enhanced with respect to the limited lighting area of the LED.

In response to the long existed problem requiring an efficient solution, it is desirable to set forth an LED structure that may not be limited in luminous efficiency by the indispensable n-electrode. To this end, the inventors of the present invention provide herein a novel LED structure. In achieving such useful structure, a particular manufacturing method is needed and will also be set forth in the present invention.

SUMMARY OF THE INVENTION

It is therefore an object of the present invention to provide a novel light-emitting device (LED) structure whose lighting area may be not blocked by its n-electrode and thus has a larger lighting area and illumination.

It is another object of the present invention to provide a method for manufacturing the inventive LED.

In the method and the corresponding device, a substrate unit having a weak spot is used to form thereon a multi-layer epitaxial structure and then the substrate unit and the multi-layer epitaxial structure are separated at the substrate unit. Next, the multi-layer epitaxial structure is extracted, a metal reflector is then disposed thereunder and a conductive substrate is bonded to the metal reflector. Next, an upper surface of the multi-layer structure is disposed with a p-electrode and a bottom side of the conductive substrate with an n-electrode whereby an LED vertical structure is formed.

The present invention also exhibits other desirable performances. First, the used substrate for formation of the epitaxial layers is sapphire, but finally other materials. Without using a sapphire, the device is easier to be sliced. Next, the present invention does not subject to an etching step, and thus has a simplified manufacturing process. Next, a larger lighting area of the device may achieve in replacing the light-emitting device with a smaller one for a fixed brightness, and reducing the cost needed. Next, wire bonding operation needs to be executed for only one time, and thus reduces cost for packaging and deficiency. Next, Si may be the material of the conductive substrate in the inventive device structure, and Si has a higher thermal conductive coefficient, about 6 times that of a sapphire. Hence, such vertical device with Si as the substrate is well suitable served as a high power device.

BRIEF DESCRIPTION OF THE DRAWINGS

To better understand the other features, technical concepts and objects of the present invention, one may clearly read the description of the following preferred embodiments and the accompanying drawings, in which.

DETAILED DESCRIPTION OF PREFERRED EMBODIMENTS

The main concept of the present invention lies in a complete vertical light-emitting device structure so that its n-electrode does not block a light generated from the light-emitting device that has inhered in a prior relevant device. When the transparent n-electrode is provided at a bottom side of the device structure, the need of better disposition region of the n-electrode may be satisfied. In doing this, the substrate generally provided under the n-GaN based layer in a prior device may not present between the n-electrode and the n-GaN based layer, or the electricity fed from the n-electrode may not enter into the n-GaN based layer and the p-and-n structure may not be valid any more. In pursuing this, the present invention provides such a completely vertical device structure and forms the same with a manufacturing method. The novel structure with a different vertical arrangement and the method realizing this device structure is considered the essential concept of the present invention.

The present invention will be described in more details as follows. In reading the detailed description, the accompanying drawings may be referenced at the same time and considered as part of the detailed description.

Figure 1:
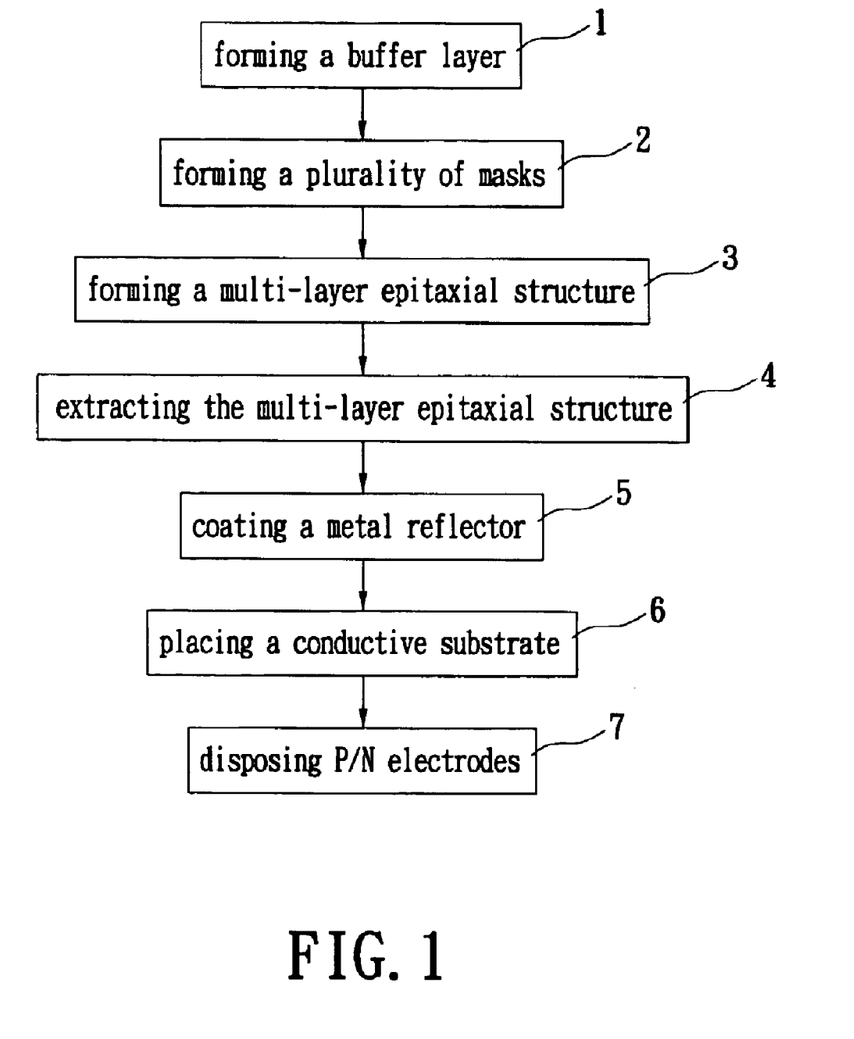
FIG. 1 depicts schematically a process of a preferred method embodiment according to the present invention.
Figure 2:
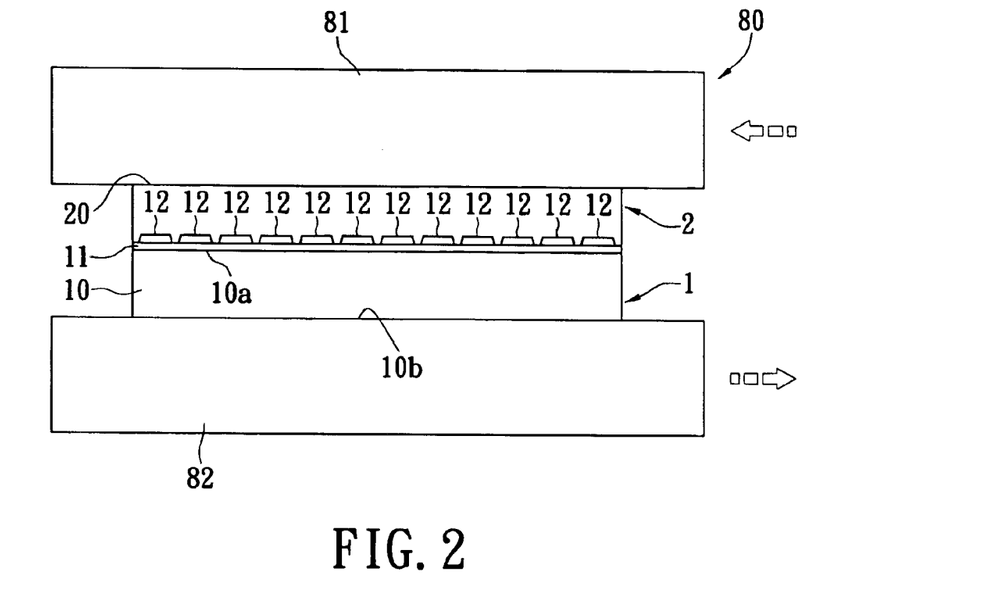
FIGS. 2 and 3 depicts schematically two stages implemented during the preferred method embodiment performed according to the present application.
Figure 3:
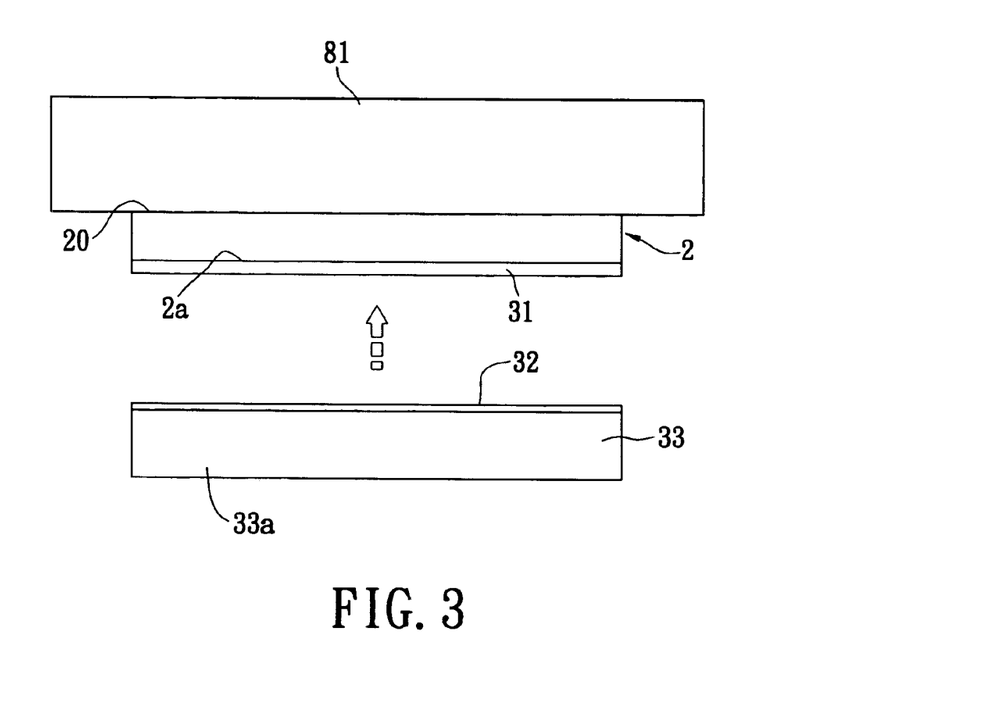

Referring to FIGS. 1 to 3, the manufacturing method according to the present invention is illustrated therein. In the description, the reference numerals given for the inventive device structure will be also used in the recitation of the steps of the inventive manufacturing method.

Step 1: forming a buffering layer. Specifically, a buffering layer 11 is formed over an upper surface 10a of a substrate 10 made of sapphire. Other substrate may be allowable as long as lattice issue may not be a problem. Step 2: forming a plurality of masks over the buffering layer. Specifically, a plurality of masks 12 are formed over the buffering layer 11 so as to form a substrate unit 1, wherein the material for the masks 12 may be $SiO_2$, SiN or $SiN_x$, and the formation may be any suitable technology. Step 3: forming a multi-layer epitaxial structure over the plurality of masks 12. Specifically, forming a multi-layer epitaxial structure 2 comprising an active layer which is generally a multi-quantum well (MQW) succeeding to Step 2.

Step 4: extracting the multi-layer epitaxial structure. Specifically, placing the substrate unit 1 and the multi-layer epixtaxial structure 2 in a fixture 80, with an upper side 20 of the epitaxial layer structure 2 fixed to an upper fixation plate 81 of the fixture 80 and a lower side of the substrate 10 to a lower fixation plate 82 of the fixture 80. Since there is no bonding force between the masks 12 and the multi-layer structure 2, the masks 12 arranged between the substrate unit 1 and the multi-layer epitaxial structure 2 form a structural weak spot in the temporary structure. Once the two fixation plates 81,82 exert at the same time a force, such as a shear force, on the substrate unit 1 and the multi-layer epitaxial structure 2, the substrate unit 1 may be smoothly removed from the substrate unit 1 and the multi-layer epitaxial structure 2 may be separately extracted, as shown in FIG. 2. To succeed in exerting a force and separating the two units 1 and 2, the two units 1 and 2 are first placed in a fixture 80 comprising an upper fixation plate 81 and a lower fixation place 82, shown in FIG. 2. Next, the unit 1 is fixed to the lower fixation place 82 and the unit 2 to the upper fixation place 81. Upon a force, such as a shear force, is jointly exerted by the fixation plates 81,82, on the two units 1,2, the structurally weak spot, i.e., the masks 12, existed between the two units 1,2 is broken, shown in FIG. 3. And the separation purpose may be achieved.

Step 5: forming a metal reflector under the multi-layer epitaxial structure 2. Specifically, a bottom side 2a of the multi-layer epitaxial structure 2 is coated with a metal reflector 31 by such as electroplating and sputtering. Before the formation of the metal reflector 31, the remaining masks 12 may be applied with an etching operation so as to remove the remaining masks 12. Then, polishing the bottom side 2a of the multi-layer epitaxial structure 2 to form a mirror surface, and then coating a metal reflector 31 thereon. Step 6: disposing a conductive substrate under the metal reflector 31. Selectively, an upper side of the conductive substrate 33 is coated with a thin metal film 32. By using of heating and pressuring, the thin metal film 32 of the conductive substrate 33 may be bonded together with the metal reflector 31, and thus the conductive substrate 33 is fixed, shown in FIG. 3. Step 7: disposing a p electrode and an n-electrode at the most upper and the lowest surface of the device structure. Specifically, by heating (or a liquid for dissolving) the upper side 20 of the multi-layer epitaxial structure 2, the structure 2 may be separable with the upper fixation plate 81. And the substrate unit 1 may be separable with the lower fixation plate 82 in a similar manner. Accordingly, a p-electrode and an n-electrode may be disposed on the upper side 20 of the multi-layer epitaxial structure 2 and a bottom side 33a of the conductive substrate 33, respectively. Through the illustrated steps in the preferred embodiment, a vertical GaN-based LED may be thus formed.

It is to be noted that the method according to the present invention may be selectively added with a step, Step 4a, between Steps 3 and 4. Step 4a is etching a portion of the masks. Specifically, an HF etchant, an B.O.E. (buffer oxide etchant) and other suitable etchants may be applied on the substrate unit 1 and the multi-layer epitaxial 2 at the $SiO_2$ mask 12 to remove a portion of the mask 12 so as to further weaken the temporary structure at the place between the substrate unit 1 and the multi-layer epitaxial 2. With this step executed, the separation and extraction of the epitaxial structure 2 from the temporary structure may be facilitated.

It is also to be noted that the thin metal film 32 is provided for bonding purpose between the conductive substrate 33 and the metal reflector 31 through heating and pressuring, and hence the thin metal film 32 may be the same or different material with the metal reflector 31 as long as the thin metal film 32 and the metal reflector 31 may be appropriately bonded together through heating and pressuring treatment.

It is also to be noted that the metal reflector 31 comprises Ag/Al material, wherein the Ag layer is first coated and the Al layer is then coated thereon so as not to expose the Ag layer, or Ag material, or other metal materials.

It is further to be noted that when the metal reflector 31 is thick enough (at least 1 $\mu$m) in Step 5 of the preferred method, the thin metal film 32 may be omitted. That is, the metal reflector 31 and the conductive substrate 33 may be bonded together directly through heating and pressuring. This is considered to be another bonding embodiment of bonding between the metal reflector 31 and the conductive substrate 33.

Figure 4:
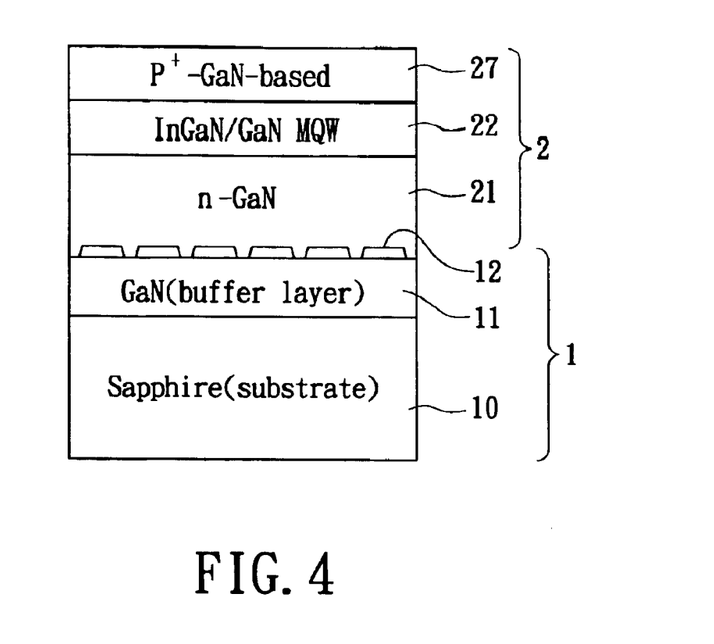
FIG. 4 depicts schematically a growth of an epitaxial layer structure according to the present invention.

Referring to FIG. 4, which shows a preferred device structure embodiment of the present invention. In the embodiment, the substrate unit 1 comprises a substrate 10, a buffering layer 11 and a plurality of masks 12. The substrate 10 may be formed of such as sapphire with a thickness of 300–500 μm and the thickness of the substrate 10 is specified for facilitating growth of a multi-layer epitaxial structure 2 formed thereon. The buffering layer 11 comprises a GaN based layer, and forms over an upper surface 10a of the substrate 10. The masks 12 are formed over the buffering layer 12 and may be $SiO_2$, SiN or $SiN_x$ to act as a weak spot.

Refer again to FIG. 4, the multi-layer epitaxial structure 2 is formed by an n-GaN based layer 21, an MQW active layer 22 and a contact layer 27 in sequence. The n-GaN based layer 21 may comprise a doped n-GaN based layer, such as one doped with Si for electricity conduction, having a thickness of 2–6 μm. The MQW active layer 22 comprises an InGaN/GaN MQW active layer. Once an electric power is fed between the n-GaN based layer 21 and the contact layer 27, the MQW active layer 22 may be excited and thus generates a light. The produced light has a wavelength ranging from 380 nm to 600 nm. The contact layer 27 is a $p^+$-GaN based layer, such as a $p^+$-GaN based layer, such as a $p^+$-GaN, a $p^+$-InGaN or a $p^+$-AlInGaN layer and the thickness thereof may be between 0.2–0.5 μm, wherein the heavy doption of the $p^+$-GaN based layer is used to obtain better ohmic contact.

Figure 5:
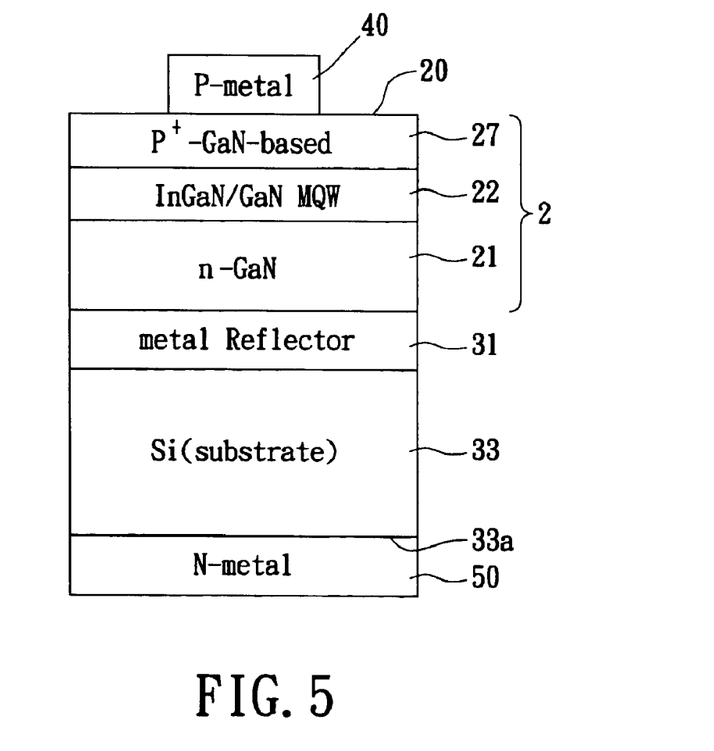
FIG. 5 depicts schematically a cross sectional view of a structure of a preferred embodiment according to the present invention.

Referring to FIG. 5 showing the preferred vertical device embodiment, a multi-layer epitaxial structure 2, a metal reflector 31, a conductive substrate 33, a p-electrode 40 and an n-electrode 50 are comprised therein. The multi-layer epitaxial structure 2 comprises an n-GaN based semiconductor layer 21, an InGaN/GaN MQW active layer 22 and a $p^+$-GaN based semiconductor layer 27 in sequence. The metal reflector 31 is coated on a bottom side of the semiconductor layer 21 used to bond with the conductive substrate 33, and has a reflectance of larger than 90%. The conductive substrate 33 may be a Si-n type substrate, and may be a Group-V element doped substrate, such as P and As, or a GaAs-n type substrate, an InP-n type substrate or a GaP-n type substrate with a thickness of 100–300 μm. The p-electrode 40 is disposed over an upper surface 20 of the multi-layer epitaxial structure 2, and specifically, over the $p^+$-GaN based semiconductor layer 27. The n-electrode 50 is disposed over a bottom side 33a of the conductive substrate 33. The metal reflector 31 is added in the device structure to reflect the light from the multi-layer epitaxial structure 2 to avoid light absorption and reduction by the Si-n type substrate. In this manner, a vertical GaN based LED is achieved.

Figure 6:
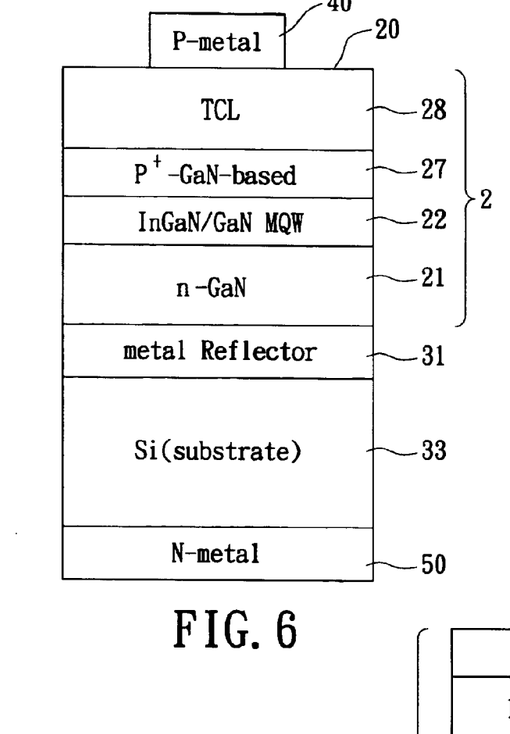
FIG. 6 depicts schematically a cross sectional view of a structure of a second embodiment according to the present invention.

Referring to FIG. 6 showing a second embodiment of the present invention, it is constructed by further forming over the $p^+$-GaN based semiconductor layer 27 of the multi-layer epitaxial structure 2 in the preferred embodiment a doped metal oxide 28 which is light transparent to a light emitted from the device structure and has a suitable thickness, i.e., the emitted light may penetrate therethrough and serves as a window layer. The doped metal oxide layer 28 may be doped ZnO, a metal oxide doped with ZnO, $In_xZn_{1-x}O$, $Sn_xZn_{1-x}O$ and $In_xSn_yZn_{1-x-y}$, etc., wherein $0 \leq X \leq 1$, $0 \leq Y \leq 1$ and $0 \leq X+Y \leq 1$. The dopant added in the doped metal oxide layer 28 may be a Group-V element, such as Al. Besides, a doped metal oxide with a refractive index of at least 1.5, an n-type metal oxide, a p-type metal oxide or a rare earth element doped metal oxide may also be the choice. The thickness of the doped metal oxide depends on the actual material used therefor, and may be 50 Å to 50 μm for ZnO doped material. The p-electrode 40 is otherwise disposed over the doped metal oxide 28 as compared to the device structure in the preferred embodiment.

Figure 7:
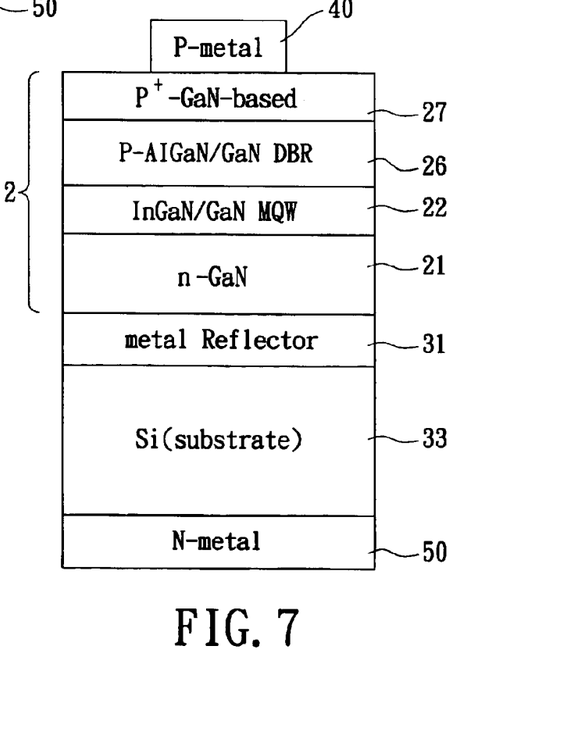
FIG. 7 depicts schematically a cross sectional view of a structure of a third embodiment according to the present invention.

Referring to FIG. 7 illustrating a third embodiment of the present invention, a p-type distributed Bragg Reflector (p-DBR) 26 may be further formed between the InGaN/GaN MQW active layer 22 and the $p^+$-GaN based semiconductor layer 27 for the structure 2 in the preferred embodiment and comprises a p-AlGaN/GaN DBR, with a reflectance of 50–80%. In this case, between the metal reflector 31 and the p-type DBR 26 forms a resonant cavity, and the produced light may also excite the MQW active layer 22 in addition to the applied electric bias.

Figure 8:
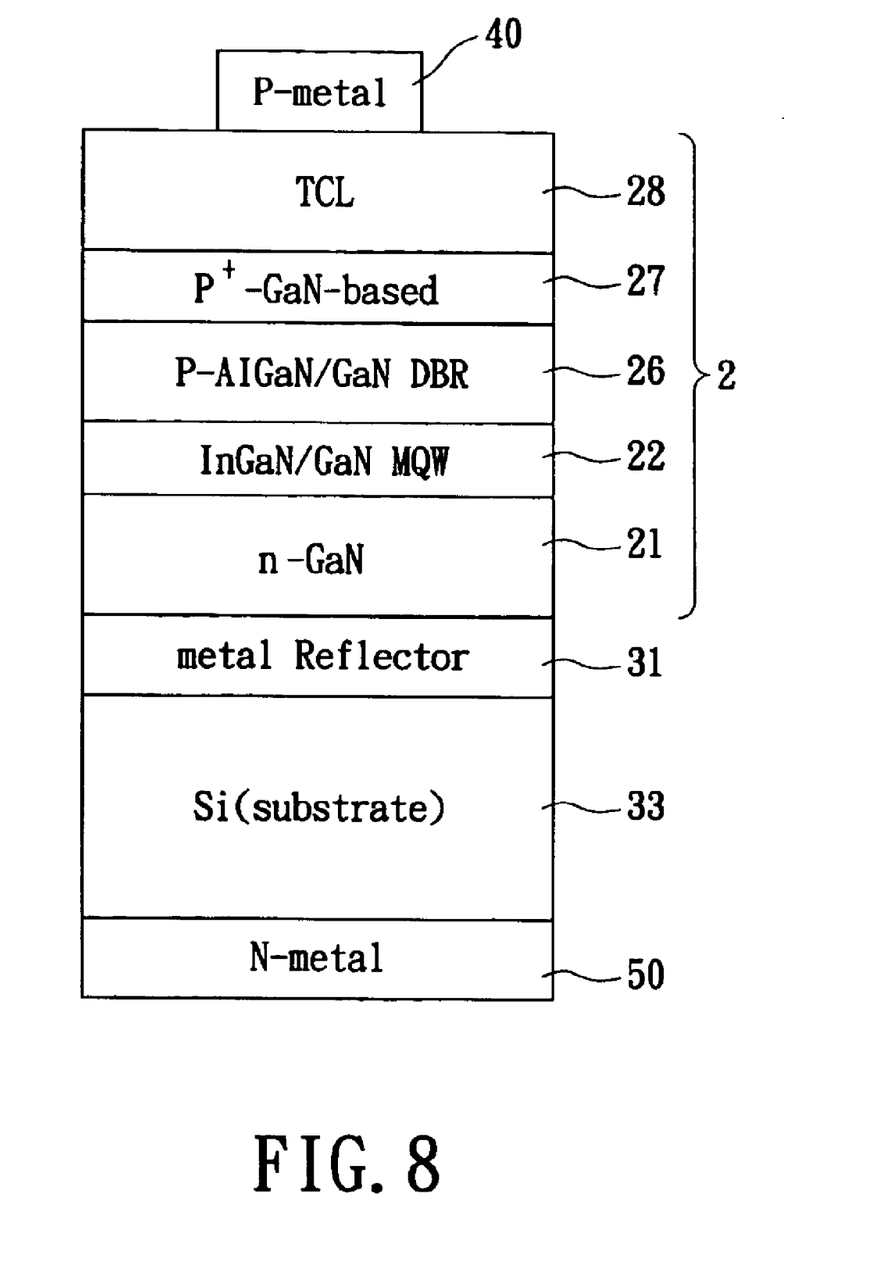
FIG. 8 depicts schematically a cross sectional view of a structure of a fourth embodiment according to the present invention.

Referring to FIG. 8 illustrating a fourth embodiment of the present invention, a metal oxide 28 is further formed over the $p^+$-GaN based semiconductor layer 27 therein, wherein the metal oxide 28 has a suitable thickness and light transparency, and is used as a window layer. The description about the metal oxide 28 has been given in the second embodiment in the present invention and will be omitted herein. The p-electrode 40 is finally disposed over an upper surface 20 of the metal oxide 28 of the multi-layer epitaxial structure 2.

Figure 9:
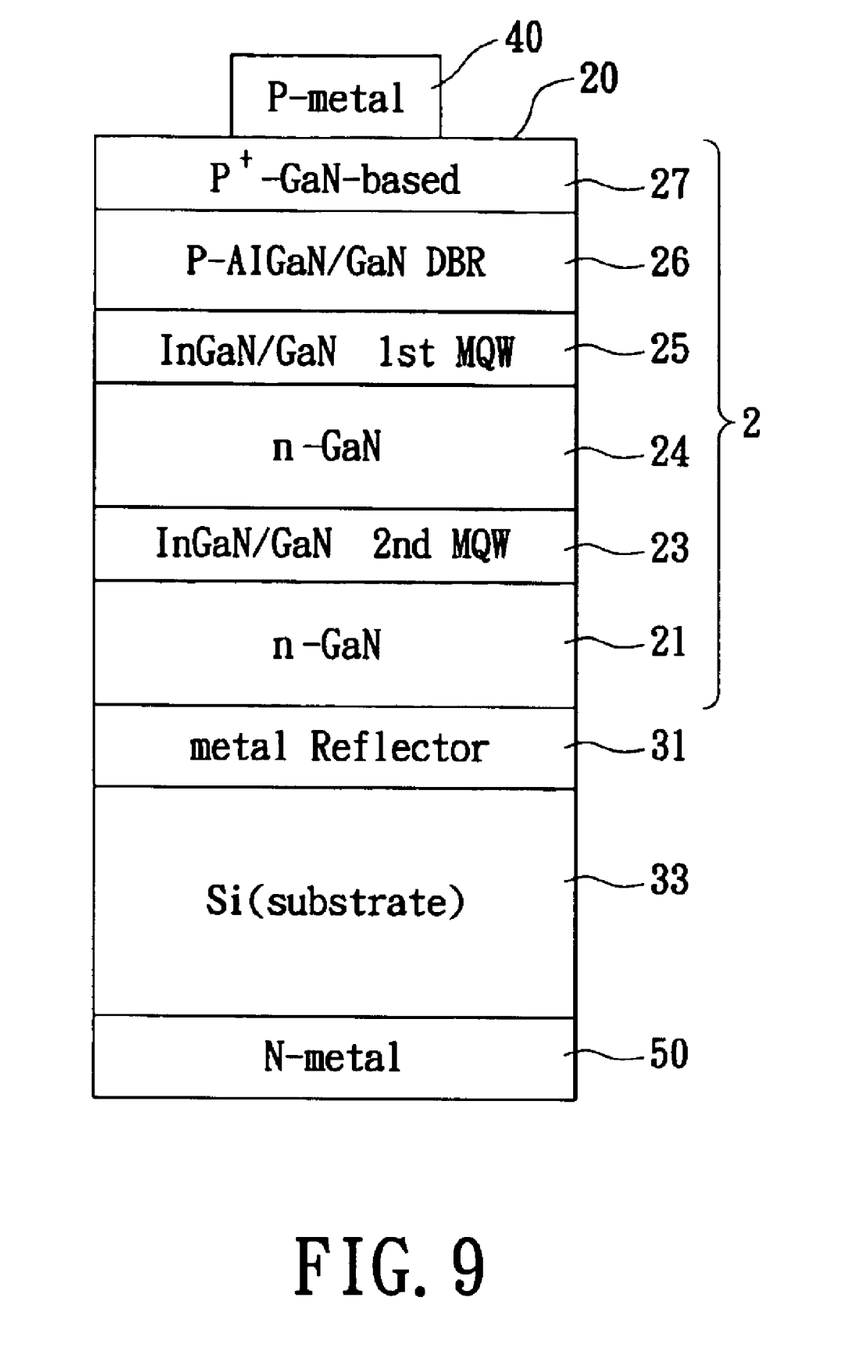
FIG. 9 depicts schematically a cross sectional view of a structure of a fifth embodiment according to the present invention.

Referring to FIG. 9 illustrating a fifth vertical device structure embodiment according to the present invention, a multi-layer epitaxial structure 2, a metal reflector 31, a conductive substrate 33, a p-electrode 40 and an n-electrode 50 are comprised. The multi-layer epitaxial structure 2 comprises an n-GaN based semiconductor layer 21, a second MQW active layer 23, a second n-GaN based layer 24, a first MQW active layer 25, a p-DBR 26 and a contact layer 27 in sequence. The n-GaN based layer 21 may be doped n-GaN, for example, one doped with Si for electricity conduction purpose, and has a thickness of 2–6 μm. The second MQW active layer 23 may be InGaN/GaN. The second n-GaN layer 24 may be doped n-GaN, for example, one doped with Si for electricity conduction purpose, and has a thickness of 2–6 μm. The first MQW active layer 25 may be InGaN/GaN. The p-AlGaN/GaN DBR has a reflectance of 50–80%. The contact layer 27 is a p-GaN based semiconductor layer, which may be such as a p-GaN, a p-InGaN and a AlInGaN semiconductor layers and has a thickness of 0.2–0.5 μm. The metal reflector 31 is coated on a bottom side of the semiconductor layer 21, by such as electroplating and sputtering, etc., used to bond together with the conductive substrate 33, and has a reflectance of larger than 90%. The conductive substrate 33 may be a Si-n type substrate, and may be doped with the Group-V elements, such as P, As, or GaAs-n type substrate, or a Ge-n type substrate a GaAs-n type substrate or a GaP-n type substrate with a thickness of 100–300 μm. The p-electrode 40 is disposed over an upper surface 20 of the multi-layer epitaxial structure 2, and specifically, over the $p^+$-GaN based semiconductor layer 27. As for details of the two MQW active layers 25,23, they are materially chosen so that the first MQW active layer 25 may emit a first light having a first wavelength of 450–510 nm and the second MQW active layer 23 may emit a second light having a second wavelength of 550–650 nm, wherein the second light is emitted by the excitation of the first light generated by the first MQW active layer 25 upon the first MQW active layer 25 is excited by an applied electric power. With such structure, not only a vertical GaN based LED is achieved, but also a light-emitting device with a resonant cavity capable of mixing two wavelengths of lights may be obtained. As a particular example, the first wavelength may be 450–510 nm and second wavelength may be 550–650 nm. In this case, the outputting light mixing in the device structure is a white colored light. And this may be deemed as a particular example of the fifth embodiment.

Figure 10:
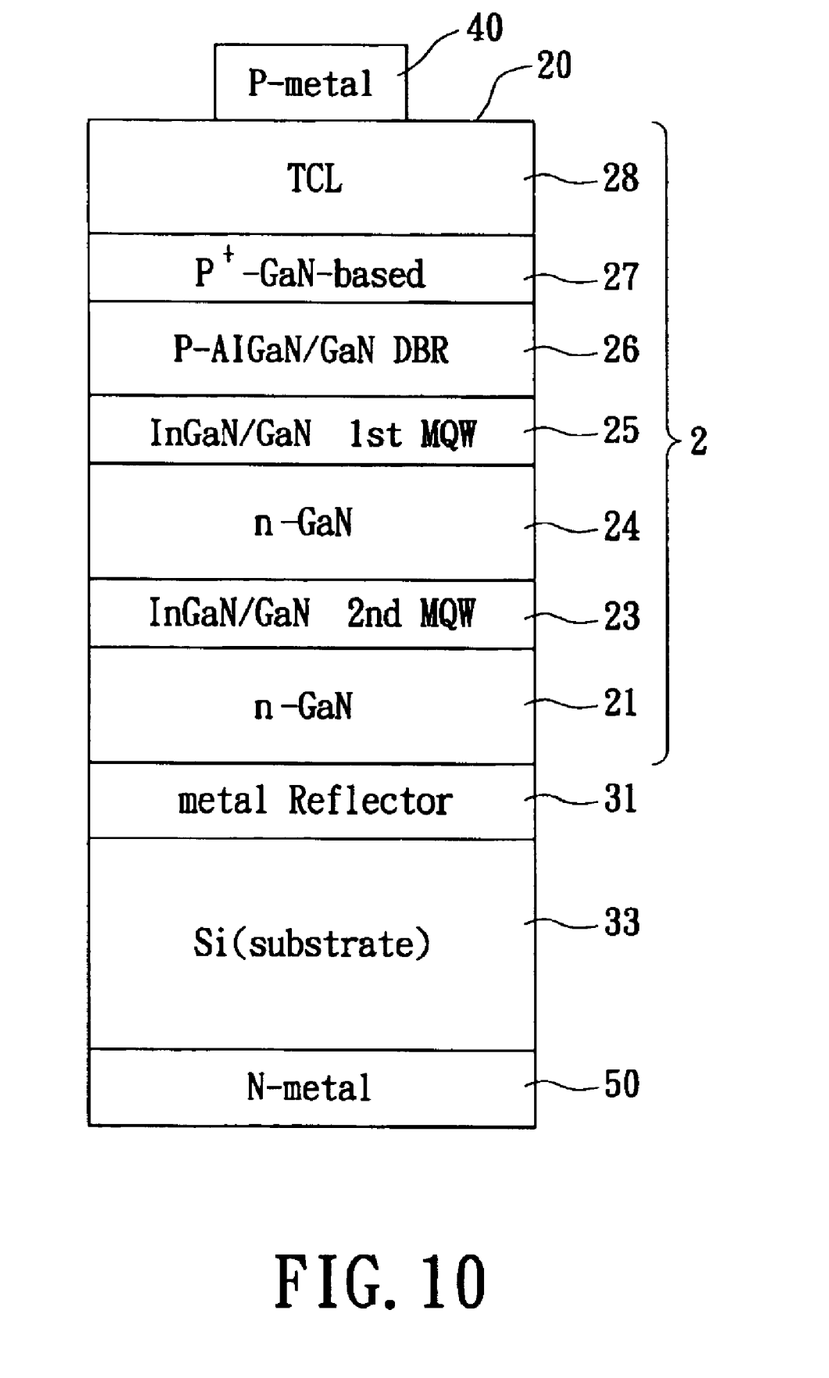
FIG. 10 depicts schematically a cross sectional view of a structure of a sixth embodiment according to the present invention.

Referring to FIG. 10 illustrating a sixth embodiment of the present invention, a doped metal oxide 28 may be further formed over the $p^+$-GaN based semiconductor layer 27, wherein the doped metal oxide 28 has a suitable thickness and light transparency, and is used as a window layer. The description about the doped metal oxide 28 may be seen in the second embodiment of the present invention and will be omitted herein. The p-electrode 40 is successively disposed over an upper surface 20 of the doped metal oxide 28 of the multi-layer epitaxial structure 2.

It is to be noted that the exposing side of the doped metal oxide used in the present invention may subject to a surface treatment to obtain a particularly textured or roughened surface, but the treated portion is limited to only the region not contact with the p-electrode 40.

It is to be further noted that the epitaxial structure in the present invention may be formed by either of self-texturing by sputtering, physical vapor deposition, ion plating, pulsed laser evaporation chemical vapor deposition and molecular beam epitaxy and other suitable technologies.

Referring to FIGS. 11 to 14, the implementation of the substrate unit having plurality of masks as a structurally weak spot is described therein.

Figure 11:
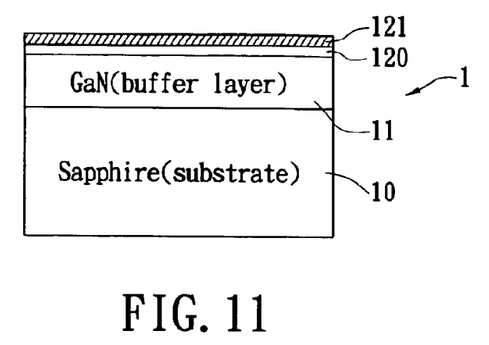
FIGS. 11-14 depicts schematically an implementation of a substrate unit according to the present invention.

As shown in FIG. 11, a GaN buffering layer 11 is formed over a substrate 10 such as sapphire, and a $SiO_2$ layer 120 is formed by such as PECVD over the GaN buffering 11 along the crystal orientation <110> of the GaN layer 11. The thickness of the $SiO_2$ layer 102 arranges from 3 to 5 $\mu$g/m. Over the $SiO_2$ layer 102 is applied with a photoresist (PR) 121.

Figure 12:
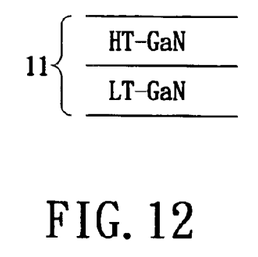

As shown in FIG. 12, the buffering layer 11 may be an LT-GaN/HT-GaN layer, wherein the LT-GaN layer represents a buffering layer first formed over the substrate 10 under a low temperature and has a thickness of 30–500 Å; while the HT-GaN layer represents a buffering layer then formed over the LT-GaN layer under a high temperature and has a thickness of 0.5–6 $\mu$m.

Figure 13:
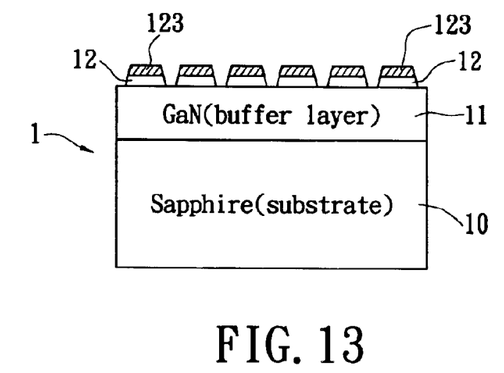

As shown in FIG. 13, the PR layer 121 results in a plurality of non-exposed masks 123 by a photomask. The exposed portion of the PR layer 121 may be cleared away by an etchant. And the portions of the $SiO_2$ layer 120 not protected by the masks 123 may also be removed by the etchant. A plurality of masks 12 are thus formed as part of the substrate unit 1.

Figure 14:
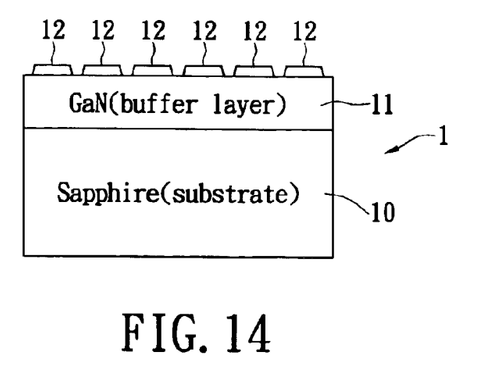

As shown in FIG. 14, when the masks 123 are cleared away, the final substrate unit 1 of the present invention is formed.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a vertical light-emitting device (LED) structure, comprising:
   (a) forming a buffering layer over a sapphire substrate;
   (b) forming a plurality of masks over said buffering layer, wherein said substrate, said buffering layer and said plurality of masks jointly form a substrate unit;
   (c) forming a multi-layer epitaxial structure over said plurality of masks, wherein said multi-layer epitaxial structure comprises an active layer; extracting said multi-layer epitaxial structure;
   (d) removing said remaining masks bonding with a bottom side of said multi-layer epitaxial structure after extracting;
   (e) coating a metal reflector over said bottom side of said multi-layer epitaxial structure;
   (f) bonding a conductive substrate to said metal reflector; and
   (g) disposing a p-electrode over an upper surface of said multi-layer structure and an n-electrode over a bottom side of said conductive substrate.

2. The method as in claim 1, wherein said step (d) is performed by applying a force on said multi-layer epixtaxial structure and the substrate unit.

3. The method as in claim 2, wherein the force is a shear force.

4. The method as in claim 2, wherein said step (d) is performed by steps of:
   (d1) placing said substrate unit and said multi-layer epitaxial structure in a fixture;
   (d2) fixing said upper surface of said multi-layer epitaxial structure by an upper fixation plate of said fixture and a bottom side of said substrate to a lower fixation plate of said fixture; and
   (d3) exerting said force on the substrate unit and said multi-layer epitaxial structure by said upper and lower fixation plates.

5. The method as in claim 1, wherein said active layer comprises a multi-quantum well (MQW) active layer.

6. The method as in claim 1, wherein said plurality of masks may be made of $SiO_2$, SiN or $SiN_x$.

7. The method as in claim 1, wherein a step (c') may be added between said steps (c) and (d), wherein said step (c') is etching a portion of said plurality of masks.

8. The method as in claim 7, wherein said etching may be performed by HF solution, a buffer oxide etchant (B.O.E) or other suitable etchant.

9. The method as in claim 1, wherein said conductive substrate has a thin metal film at a upper side, and may bond with said metal reflector by heating and pressuring.

10. The method as in claim 9, wherein said thin metal film is made of a material the same as said metal reflector or different with said metal reflector but may bond with said metal reflector together by heating and pressuring.

11. A method of forming a vertical device structure for a light-emitting device (LED), comprising:
   (a) forming a buffering layer over a sapphire substrate;
   (b) forming a plurality of masks over said buffering layer, wherein said substrate, said buffering layer and said plurality of masks jointly form a substrate unit;
   (c) forming a multi-layer epitaxial structure over said plurality of masks, wherein said multi-layer epitaxial structure comprises an multi-quantum well (MQW) active layer;
   (d) placing said multi-layer epitaxial structure and said substrate unit in a fixture and separating said multi-layer epitaxial structure and said substrate unit;
   (e) removing said remaining masks bonding with a bottom side of said multi-layer epitaxial structure after extracting;
   (f) coating a metal reflector over said bottom side of said multi-layer epitaxial structure;
   (g) bonding a conductive substrate to said metal reflector; and
   (h) disposing a p-electrode over an upper surface of said multi-layer structure and an n-electrode over a bottom side of said conductive substrate.

12. The method as in claim 11, wherein said step of separating is performed by applying a shear force on said multi-layer epixtaxial structure and the substrate unit.

13. The method as in claim 11, wherein said placing and separating is performed by steps of:

(d1) fixing said upper surface of said multi-layer epitaxial structure by an upper fixation plate of said fixture and a bottom side of said substrate to a lower fixation plate of said fixture; and (d2) exerting said shear force on the substrate unit and said multi-layer epitaxial structure by said upper and lower fixation plates.

14. The method as in claim 11, wherein said plurality of masks may be made of $SiO_2$, SiN or $SiN_x$.

15. The method as in claim 11, wherein a step (c') may be added between said steps (c) and (d), wherein said step (c') is etching a portion of said plurality of masks.

16. The method as in claim 15, wherein said etching may be performed by an HF solution, a buffer oxide etchant (B.O.E) or other suitable etchant.

17. The method as in claim 11, wherein said conductive substrate has a thin metal film at a upper side, and may bond with said metal reflector by heating and pressuring, and said thin metal film is made of a material the same as said metal reflector or different with said metal reflector but may bond with said metal reflector together by heating and pressuring.

18. The method as in claim 3, wherein said step (d) is performed by steps of:

(d1) placing said substrate unit and said multi-layer epitaxial structure in a fixture;

(d2) fixing said upper surface of said multi-layer epitaxial structure by an upper fixation plate of said fixture and a bottom side of said substrate to a lower fixation plate of said fixture; and (d3) exerting said force on the substrate unit and said multi-layer epitaxial structure by said upper and lower fixation plates.

19. The method as in claim 12, wherein said placing and separating is performed by steps of:

(d1) fixing said upper surface of said multi-layer epitaxial structure by an upper fixation plate of said fixture and a bottom side of said substrate to a lower fixation plate of said fixture; and (d2) exerting said shear force on the substrate unit and said multi-layer epitaxial structure by said upper and lower fixation plates.

* * * * *